United States Patent [19]
Willer

[11] Patent Number: 4,774,206
[45] Date of Patent: Sep. 27, 1988

[54] METHOD FOR THE MANUFACTURE OF A SELF-ALIGNED METAL CONTACT

[75] Inventor: Josef Willer, Oberschleissheim, Fed. Rep. of Germany

[73] Assignee: Siemens Aktiengesellschaft, Berlin & Munich, Fed. Rep. of Germany

[21] Appl. No.: 27,332

[22] Filed: Mar. 18, 1987

[30] Foreign Application Priority Data

Mar. 19, 1986 [DE] Fed. Rep. of Germany ....... 3609274

[51] Int. Cl.⁴ .............................................. H01L 21/28
[52] U.S. Cl. .................................... 437/175; 437/176; 437/187; 437/203; 437/944; 437/41; 156/657; 357/15; 148/DIG. 100; 148/DIG. 139
[58] Field of Search ................ 437/944, 203, 187, 175, 437/176, 229, 238, 245, 40, 41; 156/643, 653, 657; 148/DIG. 100, DIG. 139; 357/15

[56] References Cited

U.S. PATENT DOCUMENTS

| | | | |
|---|---|---|---|
| 3,996,656 | 12/1976 | Cook, Jr. | 437/187 |
| 4,144,101 | 3/1979 | Rideout | 437/944 |
| 4,326,330 | 4/1982 | LePage et al. | 437/944 |
| 4,339,305 | 7/1982 | Jones | 437/203 |
| 4,489,481 | 12/1984 | Jones | 437/187 |
| 4,507,853 | 4/1985 | McDavid | 437/187 |
| 4,525,919 | 7/1985 | Fabian | 437/944 |
| 4,551,905 | 11/1985 | Chao et al. | 437/203 |
| 4,593,307 | 6/1986 | Rupprecht et al. | 357/67 |
| 4,599,790 | 7/1986 | Kim et al. | 437/187 |
| 4,694,564 | 9/1987 | Enoki et al. | 437/175 |

OTHER PUBLICATIONS

Higashika et al, "Sidewall-Assisted . . . " Extended Abstracts of the 15th Conference on Solid State Devices and Materials, 1983, pp. 69–72.
Teruda et al, "Self-Aligned . . . " GaAs IC Symposium, 1985, pp. 138–141.
"Self Aligned Dummy Gate Sidewall-Spaced MESFET" IBM TDB, vol. 28, No. 7, 12/85, pp. 2767–2768.
Rode et al, "Gallium . . . " Solid State Technol., 2/85, pp. 209–215.
Lee et al, "Self-Aligned . . . " IEEE Trans. Elec. Dev., vol. ED-32, 4/85, No. 4, pp. 848–850.
Murmillian et al, "High Temperature . . . " IBM TDB, vol. 26, No. 12, 5/84, pp. 6506–6507.

Primary Examiner—Brian E. Hearn
Assistant Examiner—Kevin McAndrews
Attorney, Agent, or Firm—Hill, Van Santen, Steadman & Simpson

[57] ABSTRACT

The manufacture of a self-aligned gate contact having a very short gate length measuring, for example, 0.3 to 0.1 micron wherein photolithography is carried out together with isotropic deposition to produce a gate contact having an extremely low lead resistance, the method utilizing a masking element which is removed by a lift-off technique.

7 Claims, 1 Drawing Sheet

METHOD FOR THE MANUFACTURE OF A SELF-ALIGNED METAL CONTACT

BACKGROUND OF THE INVENTION

1. Field of the Invention

The present invention is in the field of manufacturing a gate contact on a semiconductor material using light actuated optical photomasking techniques for generating a structured doping, metal deposition, or the like.

2. Description of the Prior Art

It has been known for more than a decade to produce self-aligned metal contacts, particularly gate contacts on silicon as a semiconductor material, the adjustment being used in conjunction with a source and/or drain region, a source and/or drain contact, a gate region, or a channel region or the like. The application of light-sensitive optical photolithography with masks for doping and/or deposition of metal for contacts and the like also is well known, utilizing light essentially in the visible wavelength range. As is known, there is a lower limit for the dimensions to be produced by exact and sharp-edged imaging of mask structures, this lower limit being dependent on the order of magnitude of the light wavelength employed so that a dimension that is significantly smaller than the wavelength of light employed in photolithography can no longer be reliably observed.

With application of light-optical photolithography alone, sharp contours could only be produced down to dimensions which are of the order of several tenths of a micron, as a minimum.

In Solid State Technology (February 1985), pages 209 to 215, there are disclosed details for the manufacture of gallium arsenide MESFET's for semiconductor materials from Groups III and V of the Periodic Table. The gate contact therein has a dimension of about 1 micron as viewed in the direction between the source and the drain. Spacings measuring at least that size exist between the gate contact and the source or the drain contact.

Further prior art is discussed in IEDM (1964) pages 194 to 197; GaAs IC Symp. Tech. Digest (1983), pages 138 through 141; Extended Abstracts of the 15th Conference on Solid State Devices and Materials, Tokyo 1983, pages 69 to 72; 12th International Symposium on GaAs and related compounds, Karuizawa, 1985, IEE ED-32 (1985), pages 848 to 850; Electronics Letters, Vol. 21 (1985), pages 804 to 805, and GaAs IC Symposium, IEE (1984), page 121. European OS No. 01 30 416 is related to the extent that it deals with the manufacture of a high-temperature resistant contact.

SUMMARY OF THE INVENTION

The present invention provides improvements in conjunction with light-optical photolithography which can be improved for the manufacture of structures having dimensions which are significantly smaller than the wavelength of the light employed in the photolithography. In particular, Schottky gate contacts can be manufactured with the invention, their dimensions seen in the direction between the source and drain and/or their spacing from the adjacent source and/or drain regions amounting to only a few tenths of a micron, down to 0.1 micron. The method of the invention is used in conjunction with the principles of self-alignment.

In accordance with the present invention, source/-drain metal contacts are applied on a semiconductor material by directional deposition, using a masking element having an undercut form. A layer suitable for use subsequent in the lift-off technique is then deposited above the metal contacts. The masking element is then removed by said lift-off technique and a surface-wide coating of electrically insulating material is deposited by isotropic deposition. The isotropically deposited layer is removed except for sidewall portions by directed, anisotropic re-etching, whereby the surface of the semiconductor material is exposed between the sidewall portions. The material of the Schottky contact is then applied to the surface of the semiconductor material between the sidewall spacers.

The method of the present invention is useful in the manufacture of electronics components comprising Group III-V semiconductor materials and implements the use of standard light-optical photolithography. In the present invention, however, an important additional step employs a contact mask, i.e., a cover structure contacting the semiconductor surface, which exists on the semiconductor surface during the succeeding planned method steps and is present for at least one further method step, whereby this structure has a different dimension of masking for a masked isotropic or essentially undirectional masked deposition or, alternatively, for anisotropic, directional erosion. The chemical vapor deposition method is useful in accordance with the first-named method steps, while dry etching such as ion etching, reactive ion etching, and the like are useful in the second-named method.

DESCRIPTION OF THE PREFERRED EMBODIMENTS

Figure 1:
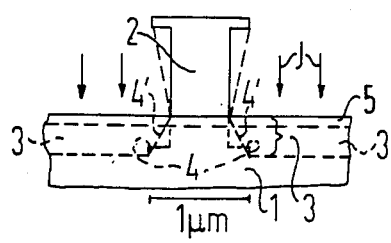
FIGS. 1-7 of the drawings represent greatly enlarged, fragmentary views of the various method steps involved in the overall method of the present invention.

The first method step illustrated in FIG. 1 is the preparation of a Group III-V semiconductor material 1 which can be present in differing forms. For a first example, the semiconductor material can be a substrate body, potentially having a semiconductor epitaxial layer situated thereon, the semicondcutor material comprising no doping or any doping as required for individual regions of the component to be manufactured. As a second example, the semiconductor material 1 can be such a semiconductor material which, at least in its upper surface 5, already includes such a doping as required for the manufacture of source and drain regions, the doping having already been annealed.

In the first example, the production of a basic doping prescribed for the gate or channel regions follows for the specific example in the surface layer 5 of the semiconductor material.

In the case of either examples mentioned, there is the application of a light optical photomask technique which, for example, uses a photoresist material. The result is the production of a masking element 2 of which there are two alternative forms shown in FIG. 1. The side edges of the second alternative are shown in broken lines. The form of the first alternative, shown in solid lines, arises from what is referred to as a single-layer phototechnique. This leads to an overhang step in the region of the surface of the originally applied photoresist layer. As is known, this can be achieved in a "hardening" of the surface layer of the photoresist layer which occurs by means, for example, of treatment with chlorobenzene before the development of the photoresist layer. This method step can also be carried in multilayer form.

The contour of the second alternative as shown in broken lines can be achieved by applying the methods described in IBM Techn. Discl. Bulletin, Vol 26 (1984), pages 6506 to 6507 or by a "reciprocal" method wherein a recessing of the photoresist layer likewise corresponding to the shape of the second alternative is manufactured by the light-optical photo process, whereby oblique sidewalls which are shown in broken lines in FIG. 1 are obtained in the photoresist material.

Figure 2:
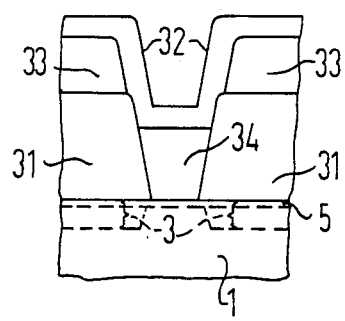

The latter alternative, using the "reciprocal" mask is carried out in such a fashion that, as shown in FIG. 2, an auxiliary layer having a surface contour 32 composed, for example, of metal is anisotropically applied, i.e., is applied directionally over a previously structured photoresist layer 31. After subsequent isotropic re-etching, the layer portions 33 and 34 remain, the portion 34 being the masking element 2 of FIG. 1 in the second alternative. After removal of the photoresist layer 31, the condition shown in FIG. 1 is also achieved in accordance with this alternative.

FIG. 1 shows the following, structured implantation identified at the arrows J for the case of the undoped substrate which leads to the doped source/drain regions 3 produces a stepped portion 4 (a bevel 4' in the broken line form of the masking element 2). In the case of the second example, there is no need for this method since appropriately source/drain doped semiconductor material has already been formed.

Figure 3:
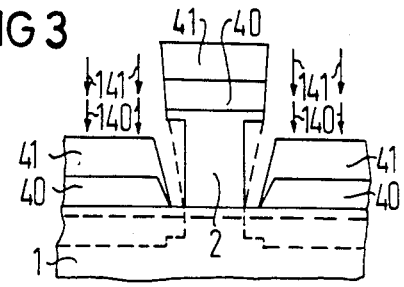

FIG. 3 indicates by means of arrows 140 the deposition of the contact metal for the source/drain contacts produced with the use of the masking element 2. This deposition can be carried out by directional vapor-deposition, directional sputtering, and the like. It results in the production of a contact 40. Subsequently, a layer 41 composed, for example, of silicon dioxide, whose directional deposition is indicated by the arrows 141 suitable for the lift-off technique is again deposited using the masking element 2. The layer 41 then already has the illustrated structuring. Afterwards the mask 2 with the portions 40, 41 on top of it is removed by lift-off.

Figure 4:
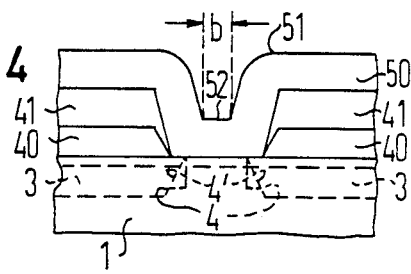

The next method (FIG. 4), used in both the first and second examples, is the isotropic application or deposition with a chemical vapor deposition method of a masking layer 50 composed, for example, of silicon dioxide. The surface structure of the layer 50 is identified at reference numeral 51. The layer thickness is such that a deep depression 52 arises whose width b shown in FIG. 4 is considerably less than the spacing of the sidewalls of the layer portions 40 and 41.

Figure 5:
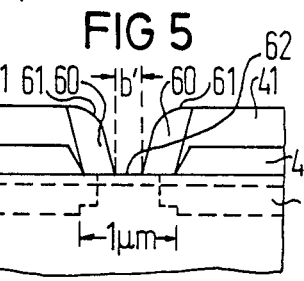

FIG. 5 shows the result of an anisotropic, i.e., directional re-etching based, for example, on a dry etching method which is carried out as the next method step. The use of ion etching or reactive ion etching as well in accordance with known procedures for the material employed for the layer 50 is possible. Only those residues which are identified at reference numeral 60 having a surface contout 61 remain from the layer 50. The re-etching is carried out to such a degree that the original surface 62 of the semiconductor material 1 is exposed, mainly in a width b' extending between the foot points of the contours 61 shown in FIG. 5, measuring only 0.3 to 0.1 micron with a 1 micron spacing existing between the edges of the two contact layer portions 40 which extend opposite each other.

Figure 6:
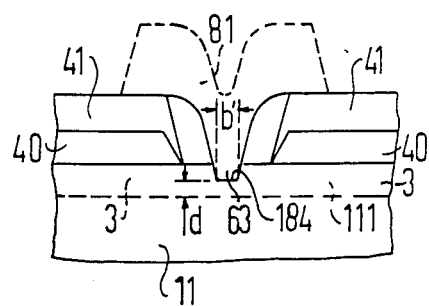

FIG. 6 illustrates the techniques comparable to those shown by FIG. 5 which are employed for the case of the second example, namely, the pre-doped substrate. The difference in comparison to the measures shown in FIG. 5 consists in producing a depression 63 in the semiconductor material 11, the depression being produced during the aforementioned re-etching. The depth of the depression 63 is such that it leads to a reduction in the thickness of the doping region 111, this doping region being that of the initially pre-doped material. The reduction in thickness supplies the doping difference which is advantageous for the gate region in comparison to the source/drain region.

Producing such a depression 63 is of particular importance for components having a prescribed, low threshold voltage and for a normally-off type for high and low threshold voltages.

As a further method step in the first example, there is the annealing of the damage of the implantation process and that occurred by the preceding re-etching. This relief of the damage can be accomplished by means of a flash-annealing method or by standard tempering, i.e., furnace anneal. Together with this anneal is the alloying diffusion of the metal of the source/drain contacts and the activation thereof. The step of annealing, however, can also be carried out before the method step of re-etching, particularly in those instances where damage by re-etching is relatively insignificant.

Figure 7:
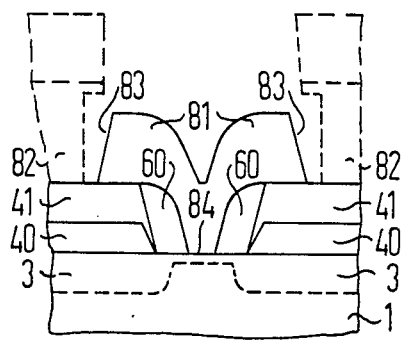

FIG. 7 shows the final structure consisting of the Schottky contact 81 applied in accordance with the succeeding method step. This method step occurs with the assistance of a mask 82 for the outside edges 83 of the contact 81. The actual, important part of the contact 81, namely the Schottky junction 84, is precisely adjusted due to the second self-alignment process of the method and is symmetrical relative to the source/drain regions 3 and the source/drain contacts 40.

The gate contact 81 can also be produced in accordance with a method of lift-off technique or by means of a previous, surface-wide metallization with subsequent re-etching.

The Schottky junction appearing at reference numeral 184 which arises in accordance with the procedure shown in FIG. 7 is shown diagrammatically in FIG. 6. It lies in the depression 63 which is provided in the case of the second example.

Passivation layers can also be provided and used in a known way during the practice of the method of the present invention. In particular, the employment of a passivation layer can be provided in combination with the step of annealing in order to supply protection against excessive arsenic evaporation when using, for example, gallium arsenide. This technique, therefore, makes an arsenic back pressure unnecessary.

In the case of the undoped semiconductor substrate, i.e., the first example, a high temperature resistant metal is required as the source/drain contact 40. For example, a layer sequence of germanium and tungsten or molybdenum or tantalum can be used for this purpose. A titanium-platinum-gold combination is also recommended for the Schottky contact 84, 184.

When the present specification refers to "light-optical" it means a range of wavelengths extending into the shortwave ultraviolet range, for example down to 200 nm or down into the range of the Excimer lasers.

One of the advantages to be achieved with the present invention, as shown in FIG. 7, is that a relatively large gate contact 81 having an extremely low lead resistance can be manufactured without difficulty even though the dimension of the length b', i.e., the actual gate length, is very small, for example on the order of 0.2 micron.

It should also be pointed out that the gate contact 84, 184 which has extremely slight length in the direction perpendicular to the plane of illustration of the Figures can also have an extremely large dimension in comparison thereto and, for example, can comprise a strip shape. Gate contacts for power FET's having gate lengths b' in the sub-micron range and having a strip length up to a few mm can thus be manufactured.

It should be evident that various modifications can be made to the described embodiments without departing from the scope of the present invention.

I claim as my invention:

1. A method for the manufacture of a self-aligned metal contact on a semiconductor material which comprises the following steps in the sequence given:
   (a) covering the surface of said semiconductor material with a masking coating,
   (b) generating a masking element having an undercut form photolithographically from said masking coating,
   (c) implanting dopant under said surface of said semiconductor material through the use of said masking element,
   (d) directionally depositing contact metal on said semiconductor material using said masking element,
   (e) directionally depositing a layer suitable for subsequent lift-off above the areas in which the contacts are to be formed through the use of said masking element,
   (f) removing said masking element,
   (g) isotropically depositing a coating layer of electrically insulating material,
   (h) removing the isotropically deposited layer except for sidewall spacers by directional anisotropicf re-etching to thereby expose the surface of the semiconductor material between said sidewall spacers, and
   (i) applying a Schottky contact material to the exposed surface of said semiconductor material between said sidewall portions.

2. A method according to claim 1 which includes the step of annealing damage in said semiconductor surface before said re-etching.

3. A method according to claim 1 which includes the step of annealing damage in said semiconductor surface after said re-etching.

4. A method for the manufacture of a self-aligned metal contact on a semiconductor material which comprises the following steps in the sequence given:

providing a semiconductor substrate having a dopant concentration in accordance with the desired source/drain doping,
covering the surface of said semiconductor material with a layer of masking material,
forming a masking element having an undercut form from said masking material,
directionally depositing contact metal on said semiconductor material with the use of said masking element,
directionally depositing a layer suitable for subsequent lift-off above the contact areas with the use of said masking element,
removing said masking element,
isotropically depositing a coating layer of electrically insulating material,
removing the isotropically deposited layer except for sidewall spacers by directional anisotropic re-etching to thereby expose the surface of the semiconductor material between said sidewall spacers, said re-etching being carried out such as to produce a depression between the sidewalls whereby a gate region is provided with a predetermined reduced thickness compared to source regions, and
applying a Schottky contact material to the exposed surface of said semiconductor material between said sidewall spacers.

5. A method according to claim 1 wherein said masking element is generated by:
applying a photoresist layer on the surface of said semiconductor material,
forming a recess in said photoresist layer corresponding to the shape of said masking element,
covering the photoresist layer directionally with a coating to provide a predetermined surface contour,
isotropically etching said layer partly to leave said surface contour, and
removing the remaining photoresist layer.

6. A method according to claim 4 wherein said masking layer is generated by:
applying a photoresist layer on the surface of said semiconductor material,
forming a recess in said photoresist layer corresponding to the shape of said masking element,
covering the photoresist layer directionally with a coating to provide a predetermined surface contour,
isotropically etching said layer partly to leave said surface contour, and
removing the remaining photoresist layer.

7. A method according to claim 1 wherein said semiconductor is a Group III–V semiconductor material.

* * * * *